United States Patent
Kesavanunnithan et al.

(10) Patent No.: US 10,897,262 B2
(45) Date of Patent: Jan. 19, 2021

(54) METHODS AND APPARATUS TO DETERMINE NON LINEARITY IN ANALOG-TO-DIGITAL CONVERTERS

(71) Applicant: Texas Instruments Incorporated, Dallas, TX (US)

(72) Inventors: Akhilesh Kesavanunnithan, Bangalore (IN); Sharat Chandra Rudrasamudram, Bangalore (IN); Henry Manoj D'Souza, Chennai (IN); Vivek Varier, Austin, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 287 days.

(21) Appl. No.: 15/620,770

(22) Filed: Jun. 12, 2017

(65) Prior Publication Data

US 2018/0269889 A1     Sep. 20, 2018

(30) Foreign Application Priority Data

Mar. 20, 2017   (IN) .............................. 201741009531

(51) Int. Cl.
*H03M 1/06*    (2006.01)
*H03M 1/10*    (2006.01)
*H03M 1/12*    (2006.01)

(52) U.S. Cl.
CPC ....... *H03M 1/1085* (2013.01); *H03M 1/1042* (2013.01); *H03M 1/12* (2013.01)

(58) Field of Classification Search
CPC .... H03M 1/12; H03M 1/0614; H03M 1/1042; H03M 1/1061; H03M 1/1245; H03M 1/1038; H03M 1/1071; H03M 1/1085; H03M 1/1033; H03M 1/1235
USPC .......................... 341/118, 120, 138–140, 155
See application file for complete search history.

(56) References Cited

U.S. PATENT DOCUMENTS

| | | | |
|---|---|---|---|
| 7,336,729 B2* | 2/2008 | Agazzi ................ | H03M 1/0624 341/118 |
| 2006/0077090 A1* | 4/2006 | Schimper ............ | H03M 1/0673 341/155 |
| 2009/0273499 A1* | 11/2009 | Lang ................... | H03M 1/1042 341/155 |

(Continued)

OTHER PUBLICATIONS

Adamo et al., "FFT test of A/D converters to determine the integral nonlinearity," article in IEEE Transactions on Instrumentation and Measurement, Research Gate, Nov. 2002, 6 pages.

(Continued)

*Primary Examiner* — Linh V Nguyen
(74) *Attorney, Agent, or Firm* — Ronald O. Neerings; Charles A. Brill; Frank D. Cimino

(57) ABSTRACT

Methods and apparatus for determining non-linearity in analog-to-digital converters are disclosed. An example apparatus includes a signal interface to receive an output of an analog-to-digital converter (ADC), the output corresponding to a periodic signal transmitted to the ADC; a signal transformer to determine at least one of a harmonic phase or a harmonic amplitude corresponding to the output; and an integral non-linearity (INL) term calculator to determine the INL of the ADC based on a characteristic of the periodic signal and the at least one of the harmonic phase or the harmonic amplitude.

4 Claims, 6 Drawing Sheets

(56) References Cited

U.S. PATENT DOCUMENTS

| | | | | |
|---|---|---|---|---|
| 2011/0038400 A1* | 2/2011 | Ishikawa | ............. | H04L 27/2337 375/219 |
| 2011/0227767 A1* | 9/2011 | O'Brien | ............... | G01D 5/2449 341/118 |
| 2011/0260899 A1* | 10/2011 | Snedeker | ............ | H03M 1/1047 341/118 |
| 2013/0169463 A1* | 7/2013 | Stein | ....................... | H03M 1/12 341/155 |
| 2015/0180495 A1* | 6/2015 | Klippel | ............... | H03M 1/1038 341/118 |
| 2017/0053655 A1* | 2/2017 | Naka | ....................... | G10L 25/12 |

OTHER PUBLICATIONS

Fangliang, Jiang, "Nonlinearity Estimation of ADCS," Beijing Orient Institute of Measurement & Test Chinese Academy of Space Technology, 2015, 5 pages.

Saada et al., "A New Approach for Modeling the Nonlinearity of Analog to Digital Converters Based on Spectral Components," Sep. 14-15, 2006, IEEE, 7 pages.

\* cited by examiner

METHODS AND APPARATUS TO DETERMINE NON LINEARITY IN ANALOG-TO-DIGITAL CONVERTERS

FIELD OF THE DISCLOSURE

This disclosure relates generally to data converters and, more particularly, to methods and apparatus to determine non-linearity in analog-to-digital converters.

BACKGROUND

Analog-to-digital converters digitize (e.g. sample) an analog signal (e.g., a sinusoid and/or radio frequency signal) to generate a digital signal corresponding to the analog signal. Analog-to-digital converters have been used to replace various other components, thereby reducing materials, costs, design, space, power, etc. Accordingly, ADCs have increasingly been used in a variety of applications in recent years, including but not limited to software defined music players, televisions, mobile phones, radios, radar systems, signal analyzers, cellular base stations, global positioning system receivers, etc.

SUMMARY

Certain examples disclosed herein determine non-linearity in analog-to-digital converters. An example apparatus includes a signal generator to transmit a periodic signal to an analog-to-digital converter (ADC). The example apparatus further includes a signal interface to receive an output of the ADC. The example apparatus further includes a signal transformer to determine at least one of a harmonic phase or a harmonic amplitude corresponding to the output. The example apparatus further includes an integral non-linearity (INL) term calculator to determine the INL of the ADC based on a characteristic of the periodic signal and the at least one of the harmonic phase or the harmonic amplitude.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
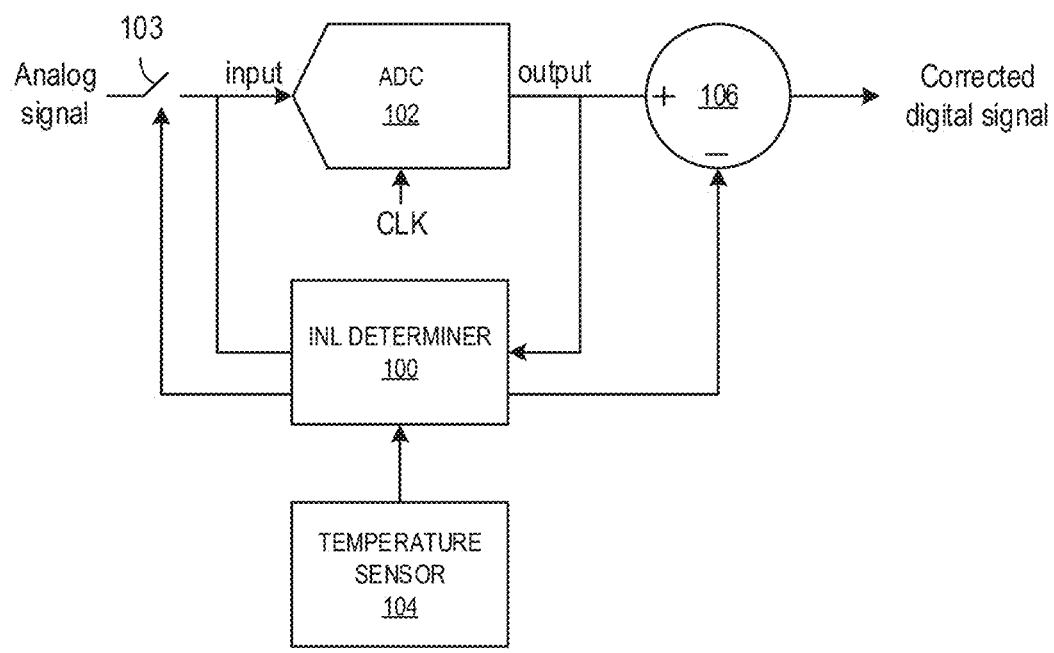
FIG. 1 is an illustration of an example non-linearity determiner to determine a non-linearity term corresponding to an example analog-to-digital converter.

Various technologies, including radio frequency (RF) sampling architectures, process received analog signals to determine data corresponding to the analog signals. In such technologies, analog-to-digital converters (ADCs) are used to convert an analog signal into a digital signal. For example, an ADC may sample an analog signal and to generate digital samples corresponding to a digital signal.

When an ADC samples an analog signal, the characteristics of the ADC may introduce integral non-linearity (INL) which typically has memory effects (e.g., inter-sample interference). Non-linearity is an impairment or deviation between an ideal input threshold value and a measured threshold level of a certain output code corresponding to an analog signal. Non-linearity causes unwanted harmonics in the output of an ADC. The unwanted harmonics cause spikes (e.g., images) in the frequency of the output (e.g., the digital signal), thereby degrading the output of the ADC. Accordingly, INL corresponds to an undesired characteristic in the output of the ADC. Examples disclosed herein determine one or more INL term corresponding to the INL of an ADC tested using different parameters (e.g., frequency, amplitude, temperature, etc.) at the manufacturing stage and/or the application stage of an ADC. In some examples, the determined INL terms are used to adjust (e.g., correct) the output of an ADC by removing (e.g., subtracting) an INL term from the output of the ADC to compensate for the natural INL of the ADC. In this manner, the effect of INL of an ADC is substantially reduced.

One conventional technique for determining INL of an ADC includes utilizing a highly accurate digital voltmeter (DVM) to measure the analog input voltage corresponding to a desired code boundary (e.g., the digital output). Such a conventional technique determines the difference between the ADC reading and the DVM reading to determine the INL. However, such a conventional technique requires a long testing time (e.g., up to four minutes, depending on the type testing and the resolution of the ADC) to average out noise in the system and to allow a required capacitor of the conventional system to charge. Another conventional technique utilizes a sine wave based histogram to determine INL. However, such a conventional technique also requires a long duration of time (e.g., up to four minutes, depending on the type testing and the resolution of the ADC) to average out noise in the system. Another conventional technique includes extracting INL from a fast Fourier transform (FFT). However, such a technique will not capture the effects of high frequency components in the INL. Accordingly approximating the INL and correction factor for phase distortion caused by the FFT is not accounted for, leading to an inaccurate INL determination. Another conventional technique includes utilizing one hit per code for an INL determination. However, such a technique is ADC architecture dependent. Additionally, to get a reliable INL estimation using such a traditional FFT technique, all harmonics must be included in the determination, thereby requiring fold back calculation which is difficult and requires additional resources. Accordingly, each test would need to be customized for an individual ADC, thereby requiring a lot of resources to customize per ADC type. Examples disclosed herein alleviate the problems of such conventional techniques by determining INL in a fast, efficient manner that accounts for phase distortion and that is independent of ADC architecture (e.g., it can be used on any kind of ADC without customization).

Examples disclosed herein include generating a pure sinusoid and/or other period signal to excite an ADC and capturing the corresponding ADC output. The ADC output is the digital samples of the pure sinusoid input. Examples disclosed herein calculate a transform (e.g., a Fourier transform, fast Fourier transform, discrete Fourier transform, etc.) of the ADC output to obtain the amplitude and phase of individual harmonics. Once the amplitude(s) and phase(s) are obtained, examples disclosed herein model the INL using Chebyshev Polynomial Approximation. Because an ADC provides coherent sampling of an input signal, each capture point (e.g., sample) of the generated sinusoid is unique and can be wrapped back into a single cycle of the pure sinusoid. Accordingly, performing an Fourier transform on the samples of a pure sinusoid will result in a frequency spectrum where the nth bin is the nth harmonic (e.g., DC lies in the $0^{th}$ Bin, the fundamental harmonic lies in the $1^{st}$ Bin, the $2^{nd}$ harmonic lies in the $2^{nd}$ Bin, etc. Therefore, examples disclosed herein can scan through N/2th harmonics without performing cumbersome fold back to obtain the same data. Such a frequency spectrum makes it easier to visualize phase noise to eliminate the noise from any computation.

Because the INL is an oddity in the transfer function of an ADC, an ADC input signal will be distorted, resulting in harmonics whose information (e.g., corresponding to magnitude and phase) can be gathered from the frequency spectrum of the response. The phase of the harmonics is distorted with reference to the fundamental harmonic. Accordingly, examples disclosed herein correct the distortion by multiplying the output by a correction factor (e.g., $\cos(\varphi_n - n\varphi_1)$, where $\varphi_n$ is the phase of the nth harmonic and q is the phase of the fundamental harmonic). In this manner, because the phase of the input signal is unknown, the correction factor generates a more accurate representation of the INL of the ADC. Examples disclosed herein achieve similar accuracy to the conventional histogram method at a fraction (e.g., approximately 2/25) of the time, thereby leading to a INL determination duration reduction of 92.08%.

In some examples disclosed herein, INL can be determined during manufacture of an ADC. In such examples, the INL may be tested based on various conditions (e.g., frequency or amplitude of the input signal, temperature of the ADC, temperature outside the ADC, external noise, and/or any other characteristic or combination of characteristics corresponding to a change in INL) and the results may be stored in memory and/or used to generate a report identifying the INL restrictions of the ADC. In some examples, the stored INL values may be used to adjust the ADC output (e.g., to apply as a correction to the INL), thereby resulting in a more accurate ADC. In some examples, because INL of an ADC may change with time, the INL may be retested to update the INL of an ADC periodically, aperiodically, and/or based on some trigger. In such examples, if the INL has changed, the stored INL value(s) will be overwritten with the newly calculated INL value(s).

FIG. 1 illustrates an example INL determiner 100 to determine a non-linearity term corresponding to an example ADC 102. FIG. 1 includes the example INL determiner 100, the example ADC 102, an example switch 103, an example temperature sensor 104, and an example summer 106.

The example INL determiner 100 of FIG. 1 determines the INL of the example ADC 102. The example INL determiner 100 generates and outputs a sinusoid and/or other periodic signal to the input of the example ADC 102 and receives the output samples of the example ADC 102. The example INL determiner 100 compares the generated sinusoid to the frequency spectrum of the output samples to determine an INL term. The example INL determine 100 obtains the frequency spectrum of the output samples by computing a Fourier transform of the output samples. For example, the INL determiner 100 generates a sinusoid $X(t) = A_n \cos(\omega t + \varphi) + B$, where $A_n$ is the amplitude of the sinusoid, ω corresponds to the period/frequency of the sinusoid, φ corresponds to a phase shift of the sinusoid, and B corresponds to a vertical shift of the sinusoid. In such an example, the output of the example ADC 102 is Y(t), where $$Y(t) = \frac{A_0}{2} + \sum_{n=1}^{\infty} A_n \cos(n\omega t + \varphi_n).$$

In order to correct for Fourier transform phase, the example INL determiner 100 multiplies the correction factor resulting in $$Y(t) = \frac{A_0}{2} + \sum_{n=1}^{\infty} A_n \cos(n\omega t + \varphi_n) \cos(\varphi_n - n\varphi_1).$$

Because INL is defined as a deviation from the actual transfer function, excluding offset and gain error, the example INL determiner 100 determines INL to be $\Sigma_{n=2}^{\infty} A_n \cos(n\omega t + \varphi_n) \cos(\varphi_n - n\varphi_1)$. The example INL determiner 100 determines the INL using the Chebyshev Polynomial identify (e.g., $T_n(\cos \Theta) = \cos(n\Theta)$). In this manner, the example INL determiner 100 determines the INL based on $\Sigma_{n=2}^{\infty} A_n T_n(n\omega t + \varphi_n) \cos(\varphi_n - n\varphi_1)$, where the cosine terms are replaced by Chebyshev polynomials. The example INL determiner 100 evaluates the Chebyshev polynomials for $2^N$ value between −1 and 1 where N corresponds to the resolution of the example ADC 102.

In some examples, the INL determiner 100 of FIG. 1 determines one or more INL values corresponding to one or more determinations of the ADC 102 (e.g., at one or more temperatures, frequencies, external noise, etc.) during the manufacturing process. In such examples, the INL determiner 100 may generate a report or otherwise output the INL value(s) based on the determination and/or store the INL values into memory (e.g., memory of the example INL determiner 100 and/or memory external to the example INL determiner 100). The stored values may be stored in association with (e.g., including) the conditions related to the INL determination (e.g., the temperature, frequency, noise, etc.). In some examples, the INL determiner 100 determines the INL value of the ADC 102 after the manufacturing process is complete to update INL values that may have changed with time. For example, the INL determiner 100 may determine the INL values of the ADC 102 periodically, aperiodically, and/or based on a trigger (e.g., instructions from a user or another device). In such examples, the INL determiner 100 opens the example switch 103 to decouple any analog signal being input into the ADC 102 so that the INL determiner 100 can input its own predetermined sinusoid for the INL determination. In some examples, the INL determiner 100 outputs an INL value to the example summer 106 to remove the INL from the output of the ADC 102. In such examples, the INL determiner 100 may select a stored INL value based on current characteristics of the example ADC 102 (e.g., temperature, signal frequency, age, etc.). The example INL determiner 100 is further described below in conjunction with FIG. 2.

The example ADC 102 of FIG. 1 samples an analog signal based on a clock (CLK) pulse to generate digital samples of the analog signal. Because there is no ideal ADC, the example ADC 102 introduces some INL to the digital sample output. As described above, INL causes unwanted harmonics in the digital signal. The example ADC 102 may correspond to any resolution (e.g., corresponding to the number of discrete analog levels that the ADC is capable of detecting).

The example temperature sensor 104 of FIG. 1 measures the ambient temperature and/or temperature of a particular component. The example temperature sensor 104 provides the example INL determiner 100 temperature data so that the INL determiner 100 can (A) store determined INL values corresponding to the sensed temperature and/or (B) select a stored INL value to apply to the example summer 106 based on the sensed temperature. The example temperature sensor 104 may be located at any location including in and/or near the example ADC 102.

The example summer 106 of FIG. 1 receives the output of the example ADC 102 and the INL term from memory (e.g., external memory, an external storage unit, an external register(s), and/or a memory device of the example INL determiner 100). The example summer 106 removes the INL term from the output of the example ADC 102 to generate a corrected digital signal the reduces, or otherwise removes, the INL from the output of the example ADC 102.

Figure 2:
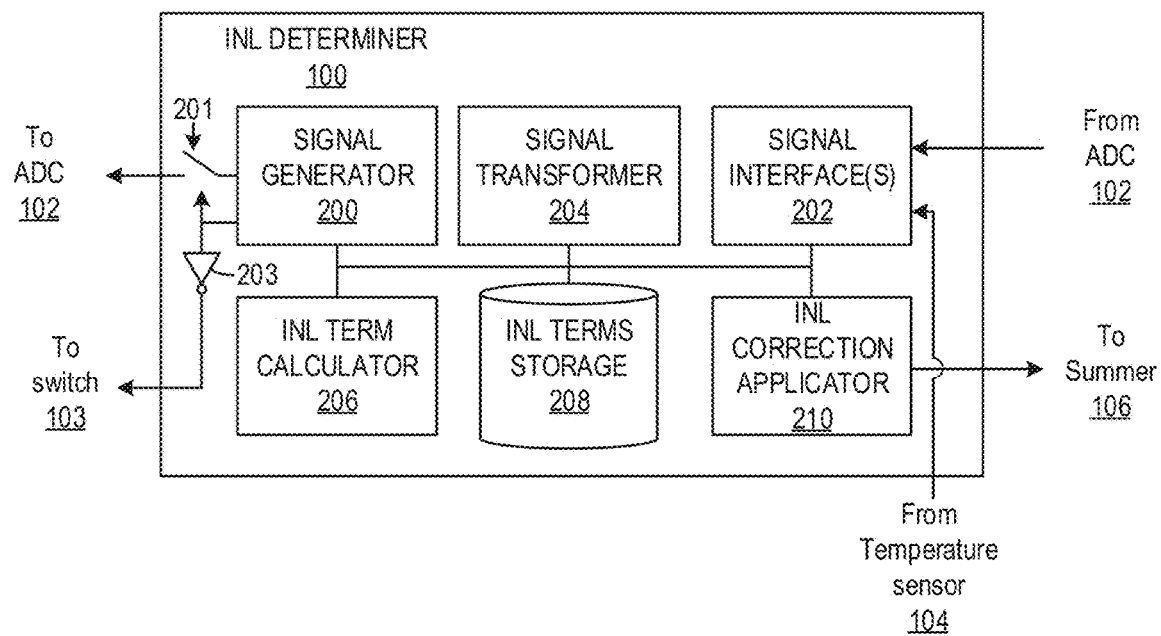
FIG. 2 is a block diagram of an example INL determiner of FIG. 1.

FIG. 2 illustrates a block diagram of the example INL determiner 100 of FIG. 1. The example INL determiner 100 includes an example signal generator 200, an example switch 201, an example signal interface 202, an example logic gate 203, an example signal transformer 204, an example INL term calculator 206, example INL terms storage 208, and an example INL correction applicator 210.

The example signal generator 200 of FIG. 2 generates a periodic signal (e.g., a pure sinusoid) with known attributes (e.g., phase angle, phase shift, amplitude, and/or vertical shift). The example signal generator 200 outputs the generated sinusoid to the input of the example ADC 102. Additionally, the example signal generator 200 sends an INL determination signal (e.g., a voltage) to the example switch 201 and the example logic gate 203. The INL determination signal is sent to the example switch 201 to close the switch, thereby enabling the generated sinusoid from being input into the input of the example ADC 102 of FIG. 1. The example logic gate 203 inverts the INL determination signal, thereby disabling the example switch 103 of FIG. 1. In this manner, the example INL determiner 100 can input a pure sinusoid without interference from a second analog signal during INL testing. Additionally, when the example INL determiner 100 is not testing (e.g., determining INL of the example ADC 102), the INL determination signal opens the example switch 201 and the inverted INL determination signal (e.g., the output of the example logic gate 203) closed the example switch 103 to allow the example ADC 102 to convert a received analog signal. Although the illustrated example of FIGS. 1 and/or 2 include the example switches 103, 201 and the example logic gate 203, the example INL determiner 100 may control the signal(s) being input in the example ADC 102 using any types of devices, including, but not limited to, field effect transistors. In some examples the signal generator 200 includes two or more signal generators (e.g., a first signal generator to generate the sinusoid and a second signal generator to enable/disable the example switches 103, 201). In such an example, the first signal generator may be located as a stand-alone component outside of the example INL determiner 100.

The example signal interface 202 of FIG. 2 receives the digital samples from the output of the example ADC 102 of FIG. 1. In some examples, the signal interface 202 receives a signal to trigger an INL term determination (e.g., from a user interface or another device). For example, during manufacturing, a user and/or device may send a trigger to test the INL value of the example ADC 102 at different points in time to allow changes in conditions (e.g., temperature). For example, during manufacture the example signal interface 202 may receive instructions to trigger an INL term determination at different temperatures. In such an example, the ambient temperature may be increased and the example signal generator 200 may trigger an INL determination when the temperature (e.g., measured by the example temperature sensor 104 of FIG. 1) reaches a temperature corresponding to the instructions. In this manner, the INL of the example ADC 102 can be tested multiple times based on multiple conditions. Additionally or alternatively, the example signal interface 202 may receive instructions (e.g., periodically, aperiodically, based on a trigger, etc.) to re-determine INL after the ADC manufacture process. In some examples, the signal interface 202 receives instructions via a user interface to report determined INL of the example ADC 102. In such examples, the signal interface 202 receives the INL values stored in the example INL terms storage 208 to generate and output the report. Additionally, the example signal interface 202 receives temperatures from the example temperature sensor 104. Although the example signal interface 202 is illustrated as a single component, the example signal interface 202 may be implemented using multiple signal interfaces (e.g., one interface for the ADC output, one or more interfaces for instructions/triggers, one interface to output a report, one for the temperature sensor, one for any other sensor, etc.).

Once the digital samples are received, the example signal transformer 204 of FIG. 2 transforms the digital samples into the frequency domain to obtain characteristics of the frequency spectrum. The example signal transformer 204 converts the digital samples using a Fourier transform. Once the example signal transformer 204 obtains the frequency spectrum, the example signal transformer 204 identifies the harmonic attributes, including harmonic amplitudes and harmonic phases.

The example INL term calculator 206 of FIG. 2 calculates the INL term based on the characteristics of the input sinusoid and the harmonic attributes of the frequency spectrum corresponding to the output samples. The example INL term calculator 206 calculates the INL term based on the Chebyshev polynomial identity (e.g., $T_n(\cos \Theta)=\cos(n\Theta)$). For example, based on a generated sinusoid input of $X(t)=A_n \cos(\omega t+\varphi)+B$, where $A_n$ is the amplitude of the sinusoid, $\omega$ corresponds to the period of the sinusoid, $\varphi$ corresponds to a phase shift of the sinusoid, and B corresponds to a vertical shift of the sinusoid, the example INL term calculator 206 determines the INL term to be $\Sigma_{n=2}^{\infty} A_n T_n(n\omega t+\varphi_n) \cos(\varphi_n - n\varphi_1)$, where (i) $T_n(n\omega t+\varphi_n)$ are the Chebyshev polynomials of $\cos(n\omega t+\varphi_n)$ for $2^N$ values between −1 and 1 where N corresponds to the resolution of the example ADC 102 and (ii) $\cos(\varphi_n - n\varphi_1)$ utilizes the phase of the nth harmonic and the phase of the fundamental harmonic to correct for the Fourier transform phase distortion. As described above, the example INL term calculator 206 is able to calculate an INL value with similar accuracy to conventional histogram techniques at a fraction (e.g., approximately 2/25) of the time, thereby leading to a INL determination duration reduction of 92.08%. The example INL term calculator 206 outputs the determined INL terms to the example INL terms storage 208.

The example INL terms storage 208 of FIG. 2 stores the INL terms determined by the example INL term calculator 206. If the example INL term calculator 206 determines multiple INL terms based on multiple testing conditions, the example INL terms storage 208 stores the characteristics of the testing conditions with the determined INL values. For example, the INL term storage 208 stores an INL term with the temperature measured by the example temperature sensor 104 at the time of the determination of the INL term, the amount of noise during the determination of the INL term, the characteristics of the generated sinusoid used to determine the INL term, and/or any other characteristics that may affect INL of the example ADC 102. Although, the example INL terms storage 208 is illustrated as part of the example INL determiner 100, the example INL terms storage 208 may be located at any location of the example illustration of FIG. 1. For example, the INL terms storage 208 may be located in the example ADC 102, the example temperature sensor 104, the example summer 106, and/or as a stand-alone component in FIG. 1.

The example INL correction applicator 210 of FIG. 2 corrects the INL of the example ADC 102 by selecting a stored INL term corresponding to the current conditions of the example ADC 102 and outputs the selected INL term to the example summer 106 to be removed from the output of the example ADC 102. In some examples, the INL correction applicator 210 selects a stored INL term based on the current conditions of the example ADC 102 (e.g., the frequency of a received signal, an amount of noise, a temperature of the example ADC 102, an ambient temperature, etc.). For example, the INL correction applicator 210 may select an INL term corresponding to a temperature value or range stored with the INL term in the example INL term storage 208 based on a current temperature sensed by the example temperature sensor 104. Although, the example INL correction applicator 210 is illustrated as part of the example INL determiner 100, the example INL correction applicator 210 may be located at any location of the example illustration of FIG. 1. For example, the INL correction applicator 210 may be located in the example ADC 102, the example temperature sensor 104, the example summer 106, and/or as a stand-alone component in FIG. 1.

While an example manner of implementing the example INL determiner 100 of FIG. 1 is illustrated in FIG. 2, one or more of the elements, processes and/or devices illustrated in FIG. 2 may be combined, divided, re-arranged, omitted, eliminated and/or implemented in any other way. Further, the example signal generator 200, the example signal interface 202, the example signal transformer 204, the example INL term calculator 206, the example INL terms storage 208, the example INL correction applicator 210, and/or, more generally, the example INL determiner 100 of FIGS. 1 and/or 2 may be implemented by hardware, software, firmware and/or any combination of hardware, software and/or firmware. Thus, for example, any of the example signal generator 200, the example signal interface 202, the example signal transformer 204, the example INL term calculator 206, the example INL terms storage 208, the example INL correction applicator 210, and/or, more generally, the example INL determiner 100 of FIGS. 1 and/or 2 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example signal generator 200, the example signal interface 202, the example signal transformer 204, the example INL term calculator 206, the example INL terms storage 208, and/or the example INL correction applicator 210 is/are hereby expressly defined to include a non-transitory computer readable storage device or storage disk such as a memory, a digital versatile disk (DVD), a compact disk (CD), a Blu-ray disk, etc. including the software and/or firmware. Further still, the example INL determiner 100 of FIG. 1 may include one or more elements, processes and/or devices in addition to, or instead of, those illustrated in FIG. 2, and/or may include more than one of any or all of the illustrated elements, processes and devices.

Figure 3:
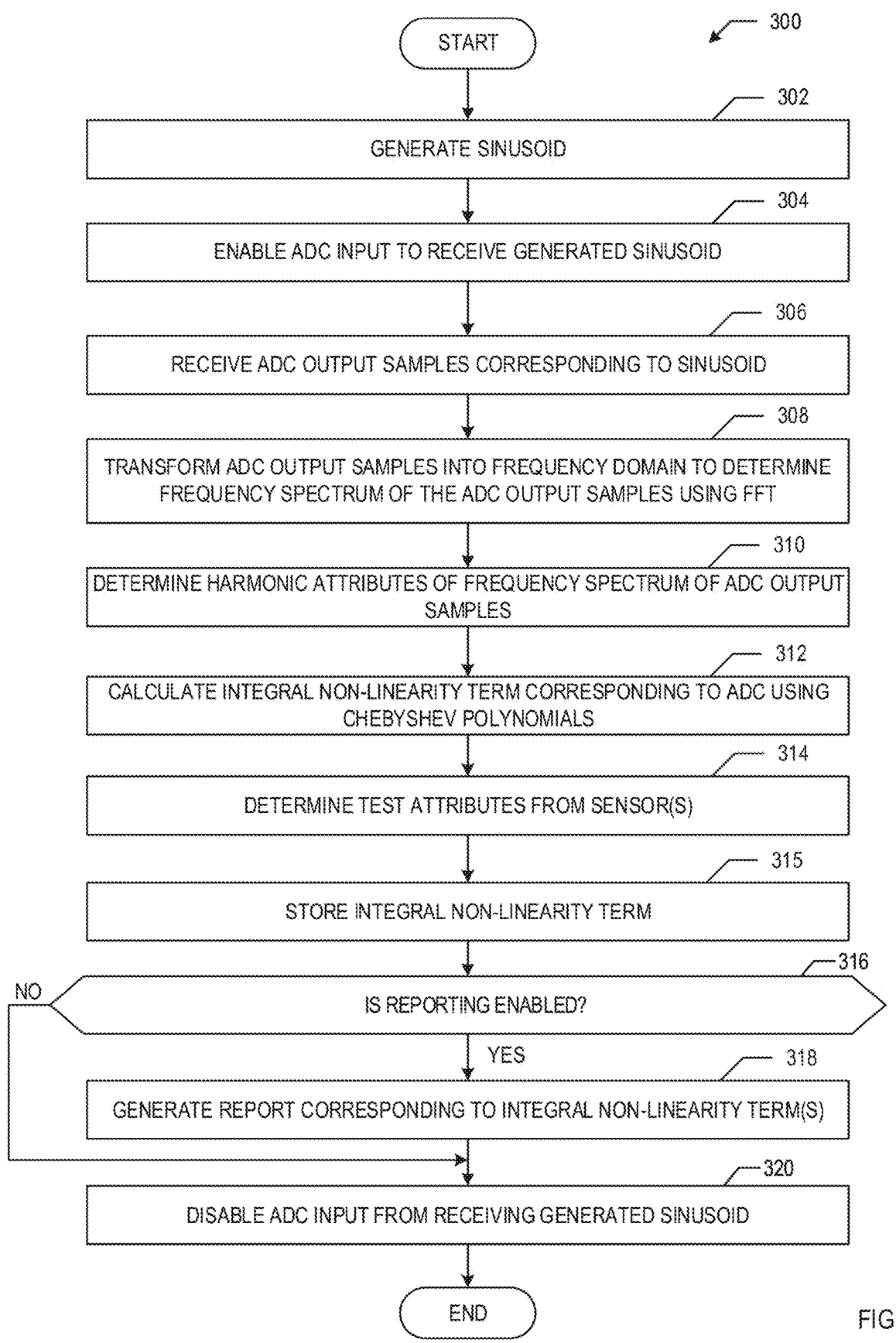
FIGS. 3-5 is a flowchart representative of example machine readable instructions that may be executed to implement the example INL determiner of FIG. 2.
Figure 4:
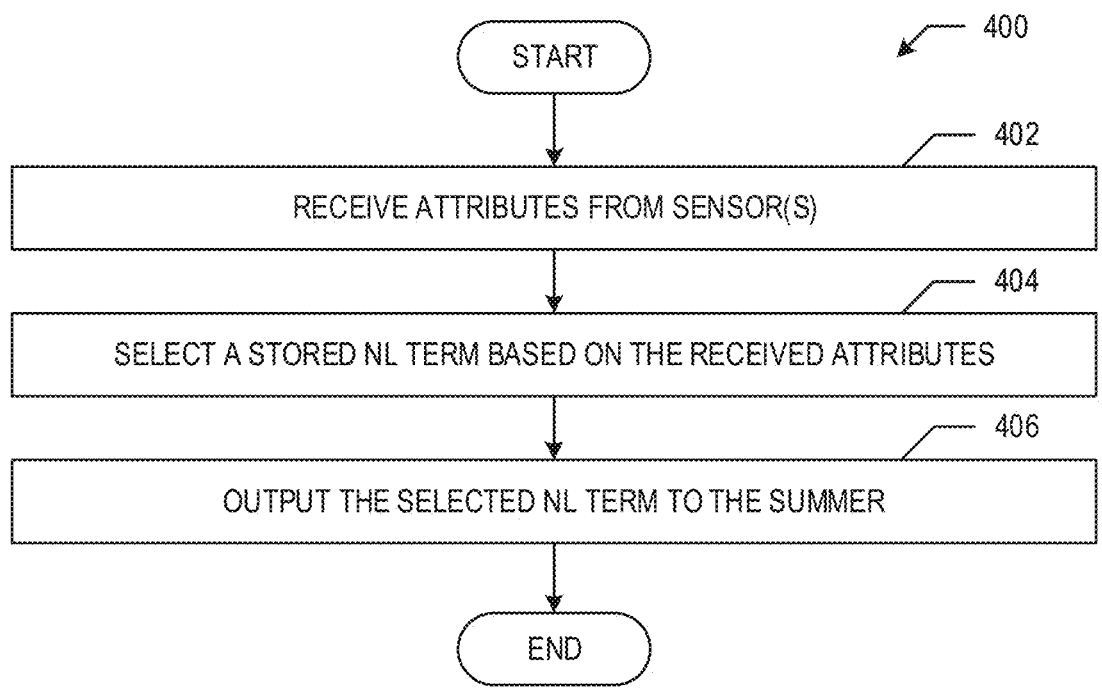
Figure 5:
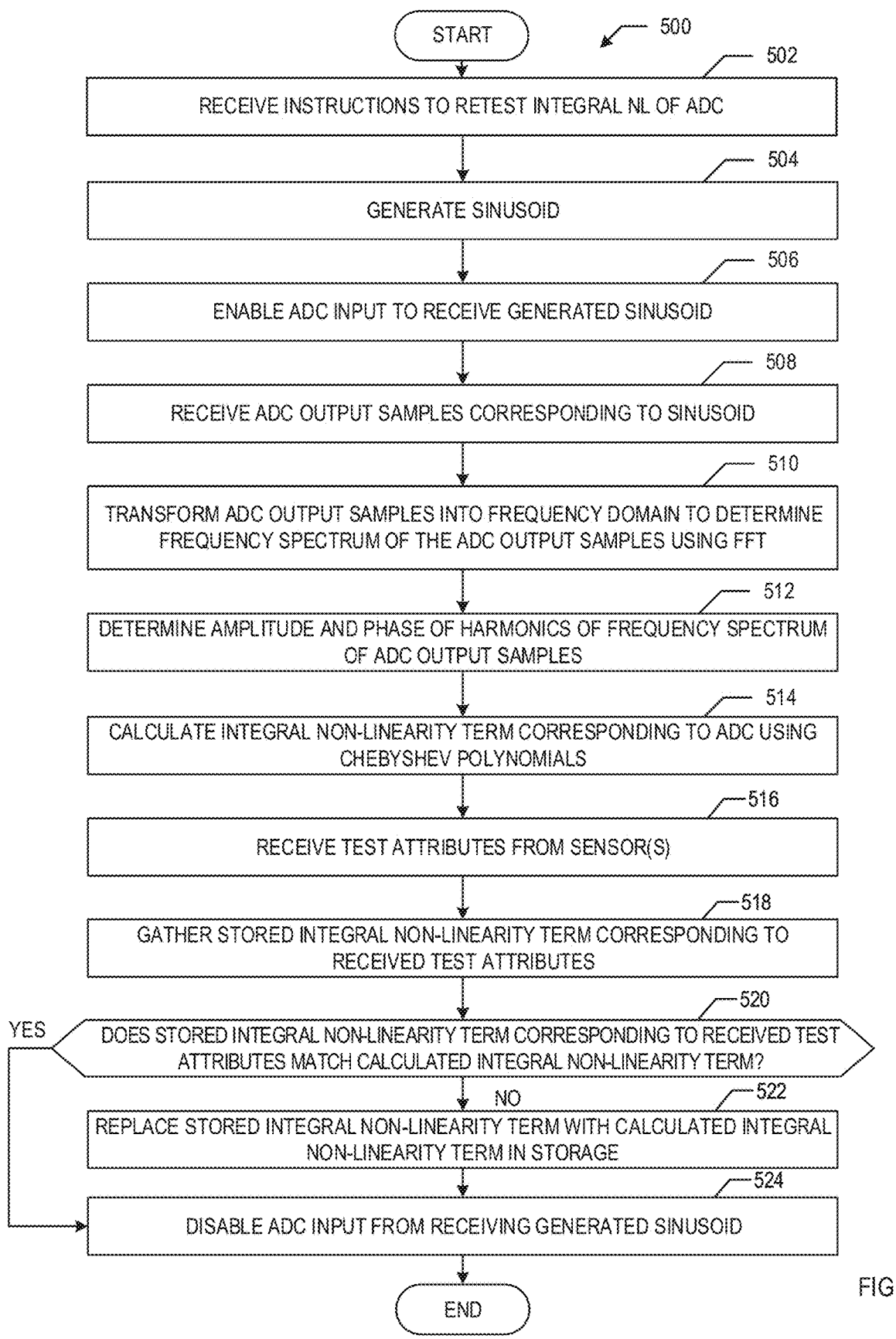

A flowchart representative of example machine readable instructions for implementing the example INL determiner 100 of FIG. 2 is shown in FIGS. 3-5. In this example, the machine readable instructions comprise a program for execution by a processor such as the processor 612 shown in the example processor platform 600 discussed below in connection with FIG. 6. The program may be embodied in software stored on a non-transitory computer readable storage medium such as a CD-ROM, a floppy disk, a hard drive, a digital versatile disk (DVD), a Blu-ray disk, or a memory associated with the processor 612, but the entire program and/or parts thereof could alternatively be executed by a device other than the processor 612 and/or embodied in firmware or dedicated hardware. Further, although the example program is described with reference to the flowchart illustrated in FIGS. 3-5, many other methods of implementing the example INL determiner 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIGS. 3-5 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

FIG. 3 is an example flowchart 300 representative of example machine readable instructions that may be executed by the example INL determiner 100 of FIG. 1 to determine the non-linearity of the example ADC 102 of FIG. 1. Although the example flowchart 300 of FIG. 3 is described in conjunction with the example INL determiner 100 and the example ADC 102 of FIG. 1, the flowchart 300 may be used in conjunction with any type of INL determiner for any type of ADC.

At block 302, the example signal generator 200 generates a sinusoid (e.g., the above X(t)). At block 304, the example signal generator 200 enables the input of the example ADC 102 of FIG. 1 to receive the generated sinusoid. For example, the example signal generator 200 enabled the input of the example ADC 102 by transmitting a signal (e.g., an INL enable signal) to close the example switch 201, thereby allowing the generated signal to be input to the example ADC 102, and opens the example switch 103 of FIG. 1 (e.g., by inverting the INL enable signal via the example logic gate 203), thereby preventing external signals from being input into the example ADC 102.

At block 306, the example signal interface 202 receives the output samples of the example ADC 102 corresponding to the generated sinusoid. At block 308, the example signal transformer 204 transforms the ADC output samples into the frequency domain to determine a frequency spectrum of the ADC output samples using a Fourier transform. At block 310, the example signal transformer 204 determines the harmonic attributes (e.g., amplitude and phase) of harmonics of frequency spectrum of ADC output.

At block 312, the example INL term calculator 206 calculates an INL term corresponding to the example ADC 102 using Chebyshev polynomials. For example, the INL calculator 206 based on $\Sigma_{n=2}^{\infty} A_n T_n(n\omega t+\varphi_n) \cos(\varphi_n-n\varphi_1)$, where (i) $\omega$ and $A_n$ correspond to the period/frequency and amplitude of the generated sinusoid, (ii) $T_n(n\omega t+\varphi_n)$ are the Chebyshev polynomials of $\cos(n\omega t+\varphi_n)$ for $2^N$ values between −1 and 1 where N corresponds to the resolution of the example ADC 102 and (iii) $\cos(\varphi_n-n\varphi_1)$ utilizes the phase of the nth harmonic and the phase of the fundamental harmonic to correct for the Fourier transform phase distortion.

At block 314, the example INL calculator 206 determines test attributes from sensor(s) (e.g., the example temperature sensor 104). Such test attributes may include characteristics of the generated sinusoid, temperature from the temperature sensor, noise in the system, etc. At block 315, the example INL term calculator 206 stores the determined INL term in the example INL terms storage 208. In some examples, the INL term is stored with the test attributes (e.g., the characteristics of the generated sinusoid, the noise level during the determination, the temperature reading from the example temperature sensor 104, a timestamp of the determination, etc.). At block 316, the example signal interface 202 determines if reporting is enabled. For example, the signal interface 202 determines if instructions have been received (e.g., via a user interface or other device) to generate, output, or otherwise display the INL terms stored in the example INL terms storage. If the example signal interface 202 determines that reporting is enabled (block 316: YES), the example signal interface 202 generates a report corresponding to the INL terms (block 318). In some examples, the signal interface 202 outputs the generated report to the requesting device.

At block 320, the example signal generator 200 disables the ADC input from receiving the generated sinusoid. For example, the signal generator 200 may transmit an INL disable signal to open the example switch 201, thereby preventing the generated sinusoid from entering into the example ADC 102. Additionally, the example logic gate 203 inverts the INL disable signal to close the example switch 103 of FIG. 1, thereby allowing the example ADC 102 to receive an analog signal from another device.

FIG. 4 is an example flowchart 400 representative of example machine readable instructions that may be executed by the example INL determiner 100 of FIG. 1 to reduce non-linearity of an analog signal sampled by the example ADC 102 of FIG. 1. Although the example flowchart 400 of FIG. 4 is described in conjunction with the example INL determiner 100 and the example ADC 102 of FIG. 1, the flowchart 400 may be used in conjunction with any type of INL determiner for any type of ADC.

At block 402, the example signal interface 202 receives one or more attributes from one or more sensors (e.g., temperature measurement from the example temperature sensor 104). The example signal interface 202 may receive any type of data that may affect the INL of the example ADC 102. For example, the signal interface 202 may receive current noise level of the system, characteristic(s) (e.g., a frequency, amplitude, etc.) of the input analog signal, and/or any other characteristic that may affect an INL determination, via one or more sensors. At block 404, the example INL correction applicator 210 selects a stored INL term based on the received attributes. As described above in conjunction with FIG. 2, the example INL term storage 208 may store various characteristics corresponding to the determination of the INL stored in the example INL terms storage 208. Additionally or alternatively, the example INL correction applicator 210 may select an INL term based on any other received attributes (e.g., noise, input signal characteristics, etc.). At block 406, the example INL correction applicator 210 outputs the selected INL term to the example summer 106. As described above in conjunction with FIG. 1, the example summer 106 adjusts the output of the example ADC 102 by removing the example INL term from the output signal.

FIG. 5 is an example flowchart 500 representative of example machine readable instructions that may be executed by the example INL determiner 100 of FIG. 1 to re-determine integral non-linearity of an analog signal sampled by the example ADC 102 of FIG. 1. Although the example flowchart 500 of FIG. 5 is described in conjunction with the example INL determiner 100 and the example ADC 102 of FIG. 1, the flowchart 500 may be used in conjunction with any type of INL determiner for any type of ADC.

At block 502, the example signal interface receives instructions to retest the INL of the example ADC 102. The instructions may be sent periodically, aperiodically, and/or based on a trigger, schedule, or condition. For example, the instructions may correspond to re-determining INL for the example ADC 102 after a threshold amount of time, when the temperature from the example temperature sensor 104 is within a particular range. Once re-determined, the clock may be reset and the ADC 102 may not re-determine the INL of the ADC for the particular temperature range until the threshold amount of time is subsequently reached.

At block 504, the example signal generator 200 generates a sinusoid (e.g., the above X(t)). At block 506, the example signal generator 200 enables the input of the example ADC 102 of FIG. 1 to receive the generated sinusoid. For example, the example signal generator 200 enabled the input of the example ADC 102 by transmitting a signal (e.g., an INL enable signal) to close the example switch 201, thereby allowing the generated signal to be input to the example ADC 102, and opens the example switch 103 of FIG. 1 (e.g., by inverting the INL enable signal via the example logic gate 203), thereby preventing external signals from being input into the example ADC 102.

At block 508, the example signal interface 202 receives the output samples of the example ADC 102 corresponding to the generated sinusoid. At block 510, the example signal transformer 204 transforms the ADC output samples into the frequency domain to determine a frequency spectrum of the ADC output samples using a Fourier transform. At block 512, the example signal transformer 204 determines the harmonic attributes (e.g., amplitude and phase) of harmonics of frequency spectrum of the ADC output.

At block 514, the example INL term calculator 206 calculates an INL term corresponding to the example ADC 102 using Chebyshev polynomials. For example, the INL calculator 206 based on $\Sigma_{n=2}^{\infty} A_n T_n(n\omega t+\varphi_n) \cos(\varphi_n - n\varphi_1)$, where (i) $\omega$ and $A_n$ correspond to the period/frequency and amplitude of the generated sinusoid, (ii) $T_n(n\omega t+\varphi_n)$ are the Chebyshev polynomials of $\cos(n\omega t+\varphi_n)$ for $2^N$ values between −1 and 1 where N corresponds to the resolution of the example ADC 102 and (iii) $\cos(\varphi_n - n\varphi_1)$ utilizes the phase of the nth harmonic and the phase of the fundamental harmonic to correct for the Fourier transform phase distortion.

At block 516, the example signal interface 202 receives one or more test attributes from one or more sensors (e.g., temperature reading form the example temperature sensor 104, noise of the system, etc.). At block 518, the example INL term calculator 206 gathers the INL term corresponding to one or more of the test attributes from the example INL terms storage 208. At block 520, the example INL term calculator 206 determines if the stored INL term corresponding to the received temperature matches the calculated INL (e.g., from block 514). If the example INL term calculator 206 determines that the stored INL term corresponding to the received temperature matches the calculated INL term (block 520: YES), there is no need to store the calculated INL term and the process continues to block 524. If the example INL term calculator 206 determines that the stored INL term corresponding to the received temperature does not match the calculated INL term (block 520: NO), the example INL term calculator 206 replaces the stored INL term with the calculated INL term in the example INL terms storage 208 (block 522). At block 524, the example signal generator 200 disables the ADC output from receiving the generated sinusoid. For example, the signal generator 200 may transmit an INL disable signal to open the example switch 201, thereby preventing the generated sinusoid from entering into the example ADC 102. Additionally, the example logic gate 203 inverts the INL disable signal to close the example switch 103 of FIG. 1, thereby allowing the example ADC 102 to receive an analog signal from another device.

Figure 6:
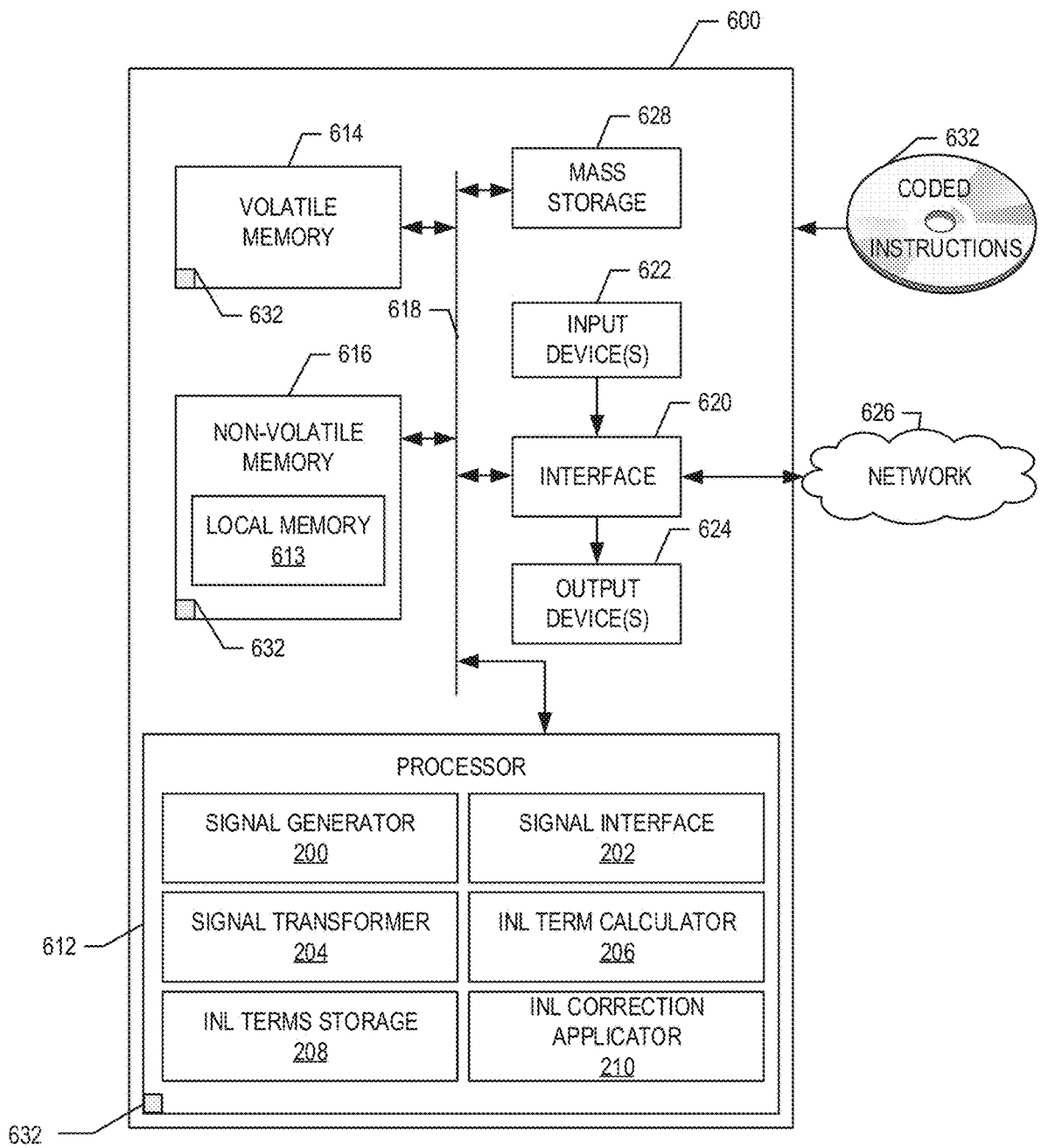
FIG. 6 is an example processor platform that may execute the example computer readable instructions of FIGS. 3-5 to implement the example INL determiner of FIGS. 1 and/or 2.

FIG. 6 is a block diagram of an example processor platform 600 capable of executing the instructions of FIGS. 3-5 to implement the example INL determiner 100 of FIGS. 1 and/or 2. The processor platform 600 can be, for example, a server, a personal computer, a mobile device (e.g., a cell phone, a smart phone, a tablet such as an iPad™), a personal digital assistant (PDA), an Internet appliance, or any other type of computing device.

The processor platform 600 of the illustrated example includes a processor 612. The processor 612 of the illustrated example is hardware. For example, the processor 612 can be implemented by one or more integrated circuits, logic circuits, microprocessors or controllers from any desired family or manufacturer. The hardware processor may be a semiconductor based (e.g., silicon based) device. In this example, the processor implements the example signal generator 200, the example signal interface 202, the example signal transform 204, the example INL term calculator 206, the example INL terms storage 208, the example INL correction applicator 210.

The processor 612 of the illustrated example includes a local memory 613 (e.g., a cache). The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 616 may be implemented by flash memory and/or any other desired type of memory device. Access to the main memory 614, 616 is controlled by a memory controller.

The processor platform 600 of the illustrated example also includes an interface circuit 620. The interface circuit 620 may be implemented by any type of interface standard, such as an Ethernet interface, a universal serial bus (USB), and/or a PCI express interface.

In the illustrated example, one or more input devices 622 are connected to the interface circuit 620. The input device(s) 622 permit(s) a user to enter data and/or commands into the processor 612. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 624 are also connected to the interface circuit 620 of the illustrated example. The output devices 624 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 620 of the illustrated example, thus, typically includes a graphics driver card, a graphics driver chip and/or a graphics driver processor.

The interface circuit 620 of the illustrated example also includes a communication device such as a transmitter, a receiver, a transceiver, a modem and/or network interface card to facilitate exchange of data with external machines (e.g., computing devices of any kind) via a network 626 (e.g., an Ethernet connection, a digital subscriber line (DSL), a telephone line, coaxial cable, a cellular telephone system, etc.).

The processor platform 600 of the illustrated example also includes one or more mass storage devices 628 for storing software and/or data. Examples of such mass storage devices 628 include floppy disk drives, hard drive disks, compact disk drives, Blu-ray disk drives, RAID systems, and digital versatile disk (DVD) drives.

The coded instructions 632 of FIGS. 3-5 may be stored in the mass storage device 628, in the volatile memory 614, in the non-volatile memory 616, and/or on a removable tangible computer readable storage medium such as a CD or DVD.

From the foregoing, it will be appreciated that example methods, apparatus and articles of manufacture have been disclosed that determine non-linearity in analog-to-digital converters. Examples disclosed herein alleviate the problems of conventional techniques by determining INL in a fast, efficient manner that accounts for phase distortion and that is independent of ADC architecture. Using examples disclosed herein, the INL of an ADC can be determined with a similar accuracy to conventional techniques at a fraction of the time, thereby leading to a INL determination duration reduction of 92.08%. This reduction saves significant time to allow the manufacturing process of ADC to be substantially reduced, thereby saving manufacturing costs.

Example 1 is an apparatus comprising a signal interface to receive an output of an ADC, the output corresponding to a periodic signal transmitted to the ADC; a signal transformer to determine at least one of a harmonic phase or a harmonic amplitude corresponding to the output; and an integral non-linearity (INL) term calculator to determine the INL of the ADC based on a characteristic of the periodic signal and the at least one of the harmonic phase or the harmonic amplitude.

Example 2 includes the subject matter of Example 1, wherein the INL corresponds to an undesired characteristic in the output of the ADC.

Example 3 includes the subject matter of Example 1, wherein the signal transformer is to determine the at least one of the harmonic phase or the harmonic amplitude corresponding to the output by transforming the output of the ADC to a frequency domain using a Fourier transform to identify a frequency spectrum of the output, the harmonic phase and the harmonic amplitude corresponding to the frequency spectrum.

Example 4 includes the subject matter of Example 3, wherein the INL term calculator determines the INL based on the harmonic phase to correct for Fourier transform phase distortion.

Example 5 includes the subject matter of Example 1, wherein the INL term calculator determines the INL using Chebyshev polynomials.

Example 6 includes the subject matter of Example 1, further including a signal generator is to enable the periodic signal from being input into the ADC and, after the INL is determined, disabling the periodic signal from being input into the ADC.

Example 7 includes the subject matter of Example 1, further including storage to store the INL.

Example 8 includes the subject matter of Example 7, wherein the INL term calculator is to store the INL in storage in association with first characteristics corresponding to a first time when the INL was determined, the first characteristics corresponding to at least one of a frequency of the periodic signal, an amplitude of the periodic signal, a temperature at the first time, or an amount of noise at the first time.

Example 9 includes the subject matter of Example 8, further including an INL correction applicator to, at a second time after the first time, reduce the INL in the output of the ADC by removing a value corresponding to the stored INL from the output of the ADC based on match between the first characteristics and second characteristics corresponding to the second time.

Example 10 includes the subject matter of Example 1, wherein the signal interface is to output a report including the INL.

Example 11 is a method comprising receiving an output of an analog-to-digital converter (ADC), the output corresponding a periodic signal transmitted to the ADC. Example 11 further includes determining a harmonic attribute corresponding to the output. Example 11 further includes determining INL of the ADC based on a characteristic of the periodic signal and the harmonic attribute.

Example 12 includes the subject matter of Example 11, wherein the INL corresponds to an undesired characteristic in the output of the ADC.

Example 13 includes the subject matter of Example 11, wherein the determining of the harmonic attribute corresponding to the output includes transforming the output of the ADC to a frequency domain using a Fourier transform to identify a frequency spectrum of the output, the harmonic attribute corresponding to the frequency spectrum.

Example 14 includes the subject matter of Example 13, further including determine the INL based on a harmonic phase to correct for Fourier transform phase distortion.

Example 15 includes the subject matter of Example 11, further including determine the INL using Chebyshev polynomials.

Example 16 includes the subject matter of Example 11, further including enabling the periodic signal from being input into the ADC and, after the INL is determined, disabling the periodic signal from being input into the ADC.

Example 17 includes the subject matter of Example 11, further including storing the INL in storage.

Example 18 includes the subject matter of Example 17, further including storing the INL in the storage in association with first characteristics corresponding to a first time when the INL was determined, the first characteristics corresponding to at least one of a frequency of the periodic signal, an amplitude of the periodic signal, a temperature at the first time, or an amount of noise at the first time.

Example 19 includes the subject matter of Example 18, further including reducing, at a second time after the first time, the INL in the output of the ADC by removing a value corresponding to the stored INL from the output of the ADC based on match between the first characteristics and second characteristics corresponding to the second time.

Example 20 is a tangible computer readable storage medium comprising instructions which, when executed, cause a processor to at least receive an output of an analog-to-digital converter (ADC), the output corresponding a periodic signal transmitted to the ADC. Example 20 further includes instructions to determine a harmonic attribute corresponding to the output. Example 20 further includes instructions to determine INL of the ADC based on a characteristic of the periodic signal and the at least one of the harmonic attribute.

It is noted that this patent claims priority from Indian Patent Application Serial Number 201741009531, which was filed on Mar. 20, 2017, and is hereby incorporated by reference in its entirety.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising: a signal interface to receive an output of an analog-to-digital converter (ADC), the output corresponding to a periodic signal transmitted to the ADC; a signal transformer to determine at least harmonic amplitude and phase attributes corresponding to the output; and an integral non-linearity (INL) term calculator to determine INL of the ADC based on a characteristic of the periodic signal and the harmonic attributes; wherein the signal transformer is to determine the harmonic attribute corresponding to the output by transforming the output of the ADC to a frequency domain using a Fourier transform to identify a frequency spectrum of the output, the harmonic attribute corresponding to the frequency spectrum; wherein the INL term calculator determines the INL based on a harmonic phase to correct for Fourier transform phase distortion.

2. The apparatus of claim 1, wherein the INL corresponds to an undesired characteristic in the output of the ADC.

3. A method comprising: receiving an output of an analog-to-digital converter (ADC), the output corresponding to a periodic signal transmitted to the ADC; determining at least harmonic amplitude and phase attributes corresponding to the output; and determining INL of the ADC based on a characteristic of the periodic signal and the harmonic attributes; wherein the determining of the harmonic attribute corresponding to the output includes transforming the output of the ADC to a frequency domain using a Fourier transform to identify a frequency spectrum of the output, the harmonic attribute corresponding to the frequency spectrum; wherein determine the INL based on a harmonic phase to correct for Fourier transform phase distortion.

4. The method of claim 3, wherein the INL corresponds to an undesired characteristic can in the output of the ADC.

* * * * *